United States Patent
Chamming's

(10) Patent No.: US 7,538,710 B2
(45) Date of Patent: May 26, 2009

(54) DEVICE FOR MEASURING AN ELECTRIC CHARGE IN DIGITIZED FORM

(75) Inventor: Gilles Chamming's, Grenoble (FR)

(73) Assignee: Commissariat a l'Energie Atomique (FR)

( * ) Notice: Subject to any disclaimer, the term of this patent is extended or adjusted under 35 U.S.C. 154(b) by 0 days.

(21) Appl. No.: 12/057,866

(22) Filed: Mar. 28, 2008

(65) Prior Publication Data

US 2009/0009376 A1    Jan. 8, 2009

(30) Foreign Application Priority Data

Mar. 30, 2007    (FR) .................................. 07 02348

(51) Int. Cl.
*H03M 1/12* (2006.01)
(52) U.S. Cl. ...................................... 341/172; 341/155
(58) Field of Classification Search ................. 341/172, 341/132, 155, 156, 158, 150, 118
See application file for complete search history.

(56) References Cited

U.S. PATENT DOCUMENTS

| | | | |
|---|---|---|---|
| 4,001,812 A * | 1/1977 | Testa et al. ................... | 341/124 |
| 5,103,230 A | 4/1992 | Kalthoff et al. | |
| 5,367,302 A | 11/1994 | Kalthoff et al. | |
| 5,638,072 A | 6/1997 | Van Auken et al. | |
| 5,726,654 A | 3/1998 | Hatae et al. | |
| 5,793,322 A * | 8/1998 | Fossum et al. ............... | 341/161 |
| 7,030,801 B2 * | 4/2006 | Luo ........................... | 341/155 |
| 7,372,392 B1 * | 5/2008 | Wan et al. ................... | 341/172 |

* cited by examiner

*Primary Examiner*—Brian Young
(74) *Attorney, Agent, or Firm*—Lowe Hauptman Ham & Berner, LLP

(57) ABSTRACT

The present invention relates to a device for measuring an electric charge in digitized form. The digitized value is coded on N bits. The device has at least a battery of N capacitors (1, 11) integrating the charge. The capacitors have a common electrode linked to a current source providing the charge. Each capacitor has an individual electrode. The values of the capacitances of the capacitors are in geometric progression. A capacitor corresponds to a bit of the digitized value. Switches (100, 101, 102, 103, 104) are connected to each individual electrode operating according to two phases, connecting the capacitors in parallel in an integration phase so as to integrate the charge in the capacitors (1, 11) and making it possible in a digitization phase to take each of the individual electrodes to two distinct potentials, corresponding to the two logic states of the bit, so as to transfer or not transfer the charge carried by the capacitor to all the other capacitors of the battery. The device has a logic unit (20) making it possible to determine in the second mode the combination of capacitors which, containing the same quantity of charge, is at a defined potential, the combination representing the digitized value.

9 Claims, 3 Drawing Sheets

US 7,538,710 B2

DEVICE FOR MEASURING AN ELECTRIC CHARGE IN DIGITIZED FORM

RELATED APPLICATIONS

The present application is based on, and claims priority from, French Application Number 0702348, filed Mar. 30, 2007, the disclosure of which is hereby incorporated by reference herein in its entirety.

FIELD OF THE INVENTION

The present invention relates to a device for measuring an electric charge in digitized form.

BACKGROUND OF THE INVENTION

Certain measurements of physical magnitudes can be represented by an electric current. It may additionally be necessary to integrate this current with respect to time, for example:
- when a sensor provides a measurement in the form of an electric current and when, for various reasons, one wishes to integrate this current over a given time period, this is notably the case in the field of visible and infrared imaging;
- when a sensor provides a measurement in the form of a current pulse, of finite duration, whose integral with respect to time represents a finite charge quantity, this is notably the case in gamma and X-ray imaging;
- generally, when a datum or a physical magnitude is represented in electrical form by the potential difference across the terminals of a capacitance.

In all these cases, in general the measurement of integrated current must be digitized in order to be utilized. The digitized value can then be utilized by digital processing or microprocessor-based means.

SUMMARY OF THE INVENTION

An aim of the invention is notably to make it possible to obtain a digital reading of an integrated-current measurement. For this purpose, the subject of the invention is a device for measuring an electric charge in the form of a digitized value coded on N bits, comprising at least:
- a battery of N capacitors for integrating the charge, the capacitors having a common electrode intended to be linked to a current source providing the charge, each capacitor having an individual electrode, the values of the capacitances of the capacitors being in geometric progression, a capacitor corresponding to a bit Q of the digitized value;
- switches connected to each individual electrode operating according to two phases: an integration phase and a digitization phase;
- means for controlling the switches, these switches connecting the capacitors in parallel in the integration phase so as to integrate the charge in the capacitors and making it possible in a digitization phase to take each of the individual electrodes to first and second distinct potentials, corresponding to the two logic states of the bit, so as to transfer or not transfer the charge carried by the capacitor to all the other capacitors of the battery;
- a logic unit for performing, in the digitization phase, N tests applied successively to each of the N capacitors of the battery, each test consisting in linking the individual electrode of the tested capacitor to the first potential, in comparing the potential reached by the common electrode with a defined potential (Vthresh), in defining the value of the bit Q corresponding to the capacitor tested as a function of the comparison result, then in linking the individual electrode to the second potential only if the bit Q is equal to a predefined value.

In a particular embodiment, an individual electrode of a capacitor is connected to a charge transfer circuit comprising switches, the said electrode being linked electrically:
- to a high potential by two switches in series, a first switch being set to the on state in the digitization phase, the state of the other switch being dependent on the state Q storing the value of the bit associated with the capacitor;
- to a low potential, by two switches in series, a first switch being set to the on state in the integration phase, the state of the other switch being dependent on the state inverse to the previous state Q.

The device comprises for example a switch for initializing the voltage between the electrodes of the capacitors.

Advantageously, it can comprise a circuit for sampling the defined potential at the end of the digitization phase. This sampling circuit comprises for example a capacitor in series with a switch.

In an embodiment with low input impedance, each individual electrode is for example connected in series with a switch electrically linking it to the output of an amplifier, an input of the amplifier being linked to a reference potential and the other input being linked to the common electrode, the switch being ordered to close during the integration phase.

In an embodiment with high input impedance, each individual electrode is for example connected in series with a switch electrically linking it to a fixed potential, the switch being ordered to close during the integration phase.

The main advantages of the invention are notably that it makes it possible to obtain a much lower total surface area of capacitor than in a conventional solution, that it allows dual digital and analogue reading and that it is insensitive to the stray capacitances of input circuits.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 1:
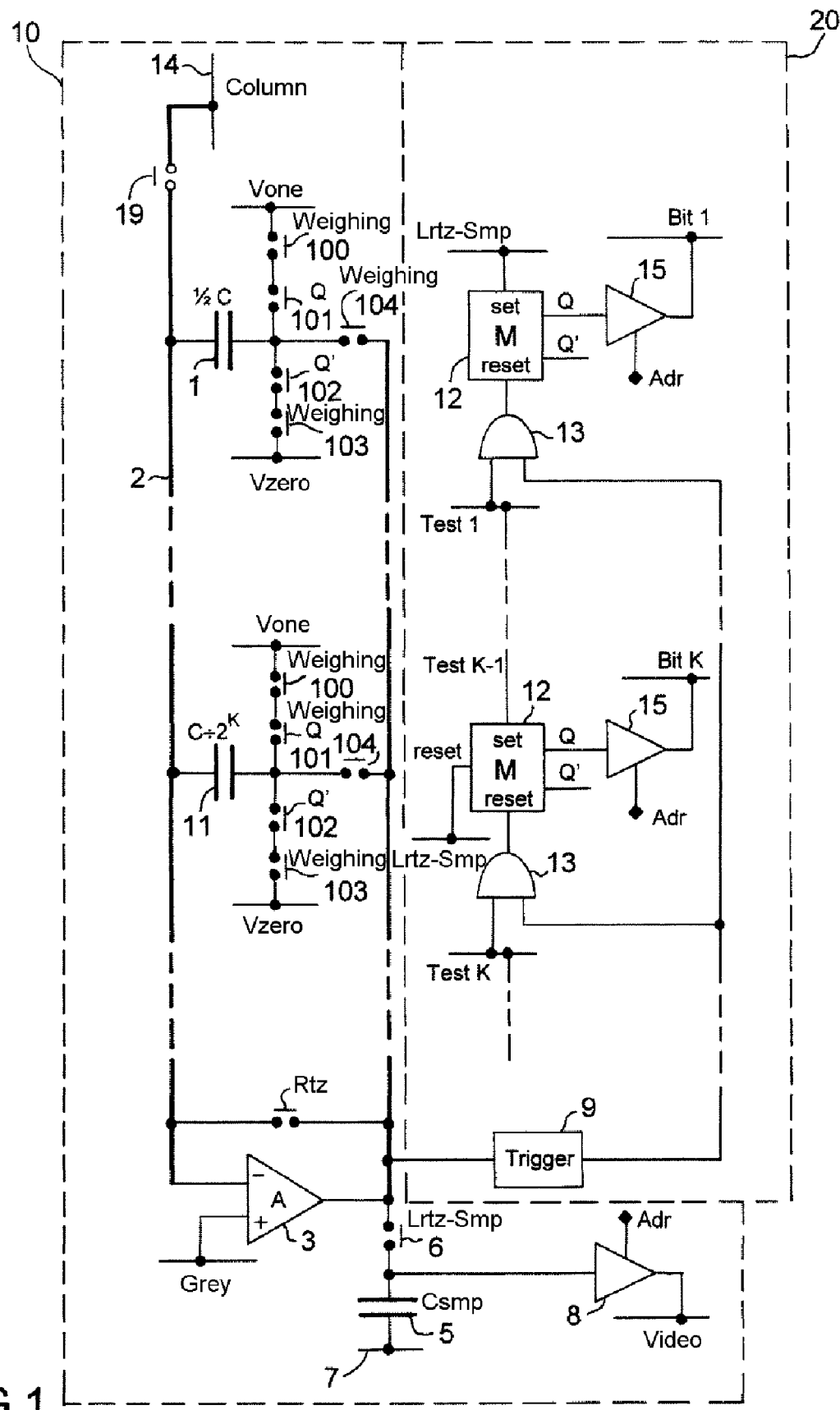
FIG. 1, a first exemplary embodiment of a device according to the invention, operating with low input impedance.

FIG. 1 illustrates a first exemplary embodiment of a device according to the invention, in a low impedance version. It comprises an analogue part 10 intended notably for storing the electric charge to be measured and a digital part 20 for digitizing the value of the stored charge.

The analogue part 10 comprises a battery of N capacitors 1, 11 connected in parallel. The values of the capacitances of the capacitors are in binary geometric progression. Thus, the value of the capacitance of the first capacitor 1 having for example the value C/2, a capacitor 11 of order k then has a capacitance value equal to $C/2^k$. These capacitors serve to store the unknown electric charge to be measured. They have a common electrode 2 connected to an input of an operational amplifier 3. The other input of the amplifier 3 is linked to a reference potential $V_{Gris}$. This amplifier 3 comprises for example a high gain.

Each capacitor additionally has an individual electrode which can be connected according to several possible wiring arrangements. In one mode of operation a wiring arrangement connects the N capacitors in parallel. In another mode of operation, a wiring arrangement allows the charge accumulated in one capacitor to be shed to the other capacitors.

These wiring arrangements use switches 100, 101, 102, 103, 104. An individual electrode is thus linked to a first high potential Vone by way of two switches 100, 101 in series, then it is linked to a second low potential Vzero by way of two other switches in series 102, 103. Finally it is linked to the output of the amplifier 3 by way of a switch in series 104.

The voltages Vone and Vzero are chosen equal to the extreme values that can be reached by the output of the amplifier 3 during the integration phase, that is to say its output excursion with a satisfactory linearity.

In a particular embodiment, the capacitors have for example a common plate forming a first electrode, each capacitor additionally having an individual plate forming the other electrode. A switch 4 connected to the terminals of the capacitors makes it possible, when it is in the closed position, for the charges to be reset to zero and for the voltage at these terminals to be reinitialized.

The output of the amplifier 3 is connected to a sampling capacitor 5, via a switch 6 common to all the capacitors, notably for storing in analogue form the final integration value. For this purpose, an electrode of the sampling capacitor 5, linked to the switch Lrtz-Smp, is additionally linked to a follower amplifier 8 for reading this analogue value, common to all the paths. The other electrode of the capacitor 5 is linked to a reference potential 7, for example the mechanical ground.

The charging current for the capacitors 1, 11 is for example supplied by a column 14 which is wired to a high impedance current source.

The digital part 20 supplements the analogue part 10. It allows the digitization of the analogue information stored in the capacitors 1, 11. It complements notably the analogue reading provided by the follower amplifier 8. The logic part provides a value coded on N bits, N being the number of capacitors in parallel, it comprises notably:

a flip-flop, also called a "trigger" in the literature, whose input is connected to the output of the high-gain amplifier 3, this "trigger" forming a low-hysteresis comparator;

for each coding bit, a memory 12, of RS or other type, and a logic gate 13 with three states for reading this memory.

An input of each gate is linked to the output of the "trigger" 9, the other input being linked to a test input. An output Q of the memory 12 gives the value of the bit, 0 or 1. Each output Q feeds for example an amplification circuit 15, or "buffer", the binary information conveyed by the bit being read as output from this "buffer".

Figure 2:
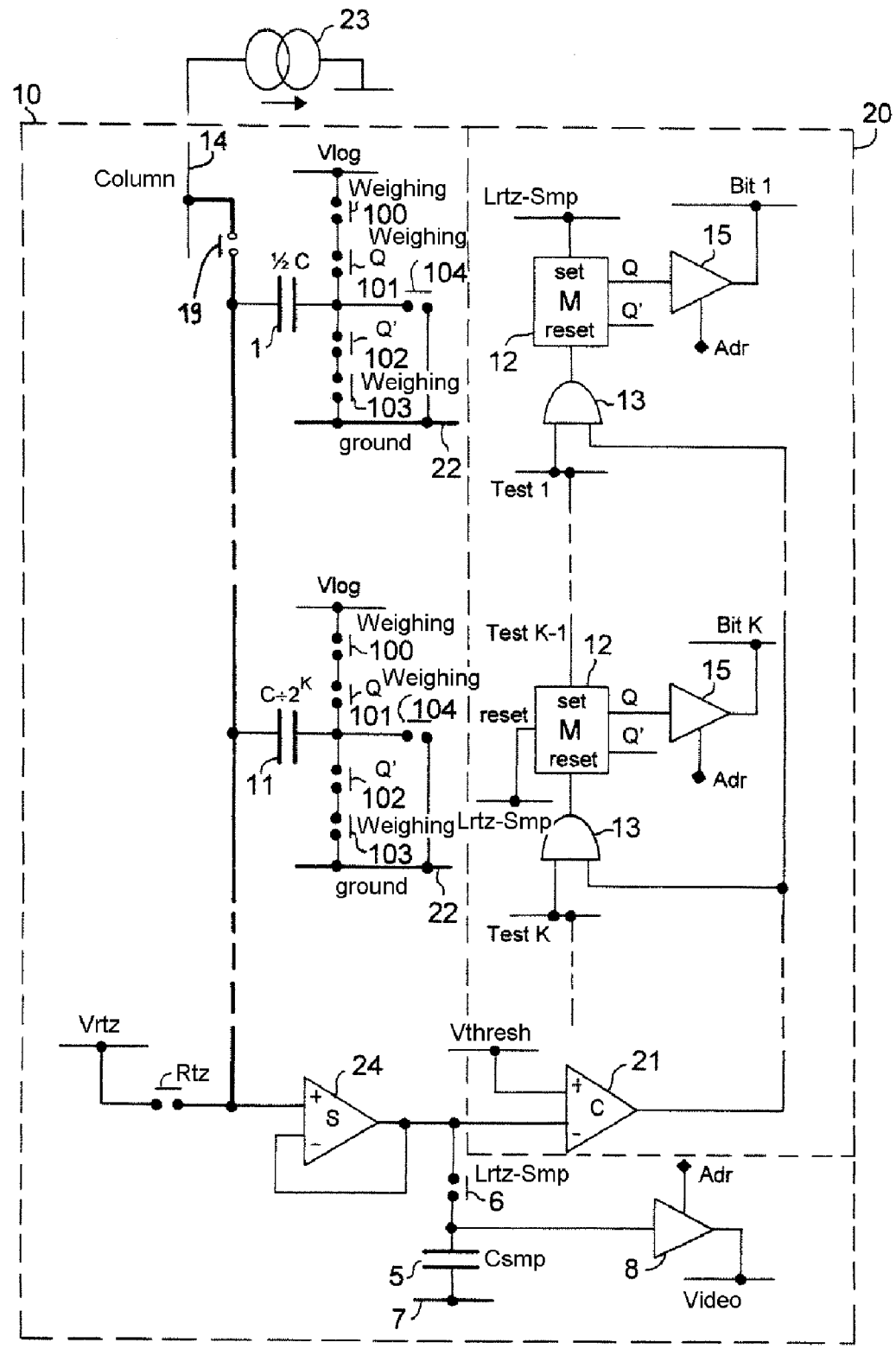
FIG. 2, a second exemplary embodiment of a device according to the invention, operating with high input impedance.

FIG. 2 illustrates another embodiment of a device according to the invention, in a version with high impedance and at a column foot. The device still comprises an analogue part 10 for storing the electric charge and a digital part 20 for digitizing the stored value. The digital part is substantially identical to that of FIG. 1, the "trigger" 9 being replaced with a comparator 21. Just as for the "trigger", the output of the comparator 21 is connected to the inputs of the gates 13.

The analogue part 10 still comprises a battery of N capacitors 1, 11 in parallel whose capacitances increase according to the same geometric progression as the setup of FIG. 1. The individual electrodes are connected to the same type of wiring arrangement of switches 100, 101, 102, 103, 104. However, the switch 104 linked in series with the individual electrode is no longer connected to an amplifier but to a ground potential. During the integration phase, that is to say during the storage of the electric charge in the capacitors, this transistor 104 is on, the electrode is then placed at the ground potential 22. Additionally, in each of these individual wiring arrangements, two switches 100, 101 link the individual electrode to a high potential Vlog and two other switches 102, 103 link this same electrode to the ground potential. The voltage Vlog is for example equal to the voltage excursion accepted on the column on completion of the phase of integrating the charge on the capacitors.

The common electrode of the capacitors is still charged by a column 14 which is itself energized by a current source 23. In the course of the integration phase the input potential varies and therefore the potential of the common electrode linked to this input. Contrary to the low-impedance setup, in the high-impedance setup it is the potential of the common electrode which varies, the potential of the individual electrodes remaining substantially fixed, substantially equal to the ground potential. In the low-impedance setup, the potential of the individual electrodes varies and the potential of the common electrode remains substantially constant.

The common electrode is linked to the input of an amplifier 24 connected in follower mode, the output of this amplifier being linked to the sampling capacitor 5 via the switch Lrtz-Smp. The output of the amplifier 24 is additionally linked to an input of the comparator 21, the other input of the comparator being linked to a potential Vthresh. The voltage Vthresh is for example the maximum value of the voltage of the column at the end of integration. The voltage difference Vthresh–Vlog is for example the minimum value of the voltage of the column 14 at the end of integration.

The common electrodes are additionally linked to a potential Vrtz via a switch Rtz. When the latter is conducting, the potential of the common electrodes is reinitialized to the voltage Vrtz. This voltage Vrtz is notably chosen according to the symmetry of the excursion of the input current.

Figure 3:
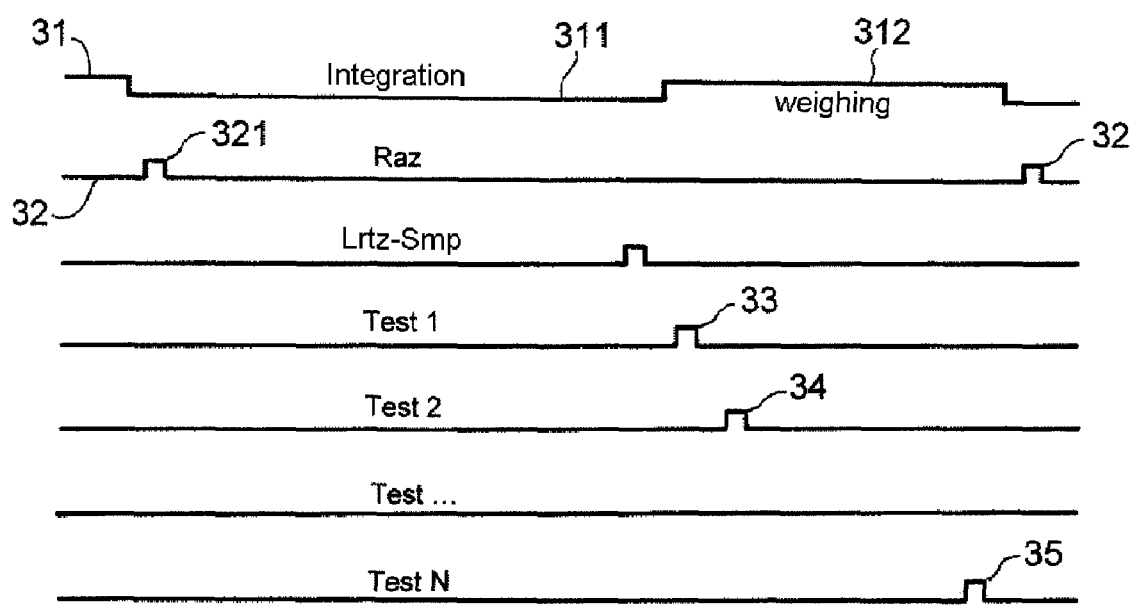
FIG. 3, an example of control signals for switches and tests generated for a device according to the invention.

FIG. 3 illustrates by timecharts the test signals and the signals controlling the various switches. A first signal 31 controls the switches associated with the individual electrode of each capacitor. This signal comprises two phases:

a first phase 311 corresponds to the integration and to the storage of the charges in the capacitors 1, 11, where the latter store up the electric charge to be measured, during this phase the signal 31 is for example in the low state or at zero;

a second phase 312 corresponds to the weighing for the digital quantization, that is to say to the determination of the digital value of the charge stored up, this weighing being described subsequently, during this phase the signal 31 is in the state inverse to the previous state, that is to say for example in the high state or at 1.

During the integration phase 311, the charging current for the capacitors 1, 11 is for example supplied by the column 14.

In the case of the low-impedance setup of FIG. 1, the individual electrodes of the capacitors are not linked to the potentials Vone and Vzero. The switches 100, 103 linking this electrode to these potentials are then set to the open state. The individual electrodes of the capacitors are all linked to the output of the amplifier 3 via the series switches 104 set to the on state.

In the case of the high-impedance setup of FIG. 2, the individual electrodes are linked to the mechanical ground, the potential of the common electrodes evolving with the electric charge.

An impulse signal 32 represents the state of the reset to zero switch 4 or Rtz for the two setups. The signal 32 shows that this switch is set to the on state 321 at the start of the integration phase 31 to allow the capacitors to be reset to the initial state. In the example of the low-impedance setup, when the switch 4 is in the on state, it short-circuits the capacitors, thereby causing them to discharge.

During the integration phase 311 the capacitors are therefore all wired up to the output of the amplifier 3 for the low-impedance setup, or to the mechanical ground for the high-impedance setup.

At the end of the integration phase 311, before the digitization phase 312, an impulse signal Lrtz-smp simultaneously performs the logic reinitialization of the memories 12 and the storage of the analogue voltage on the sampling capacitor 5. For this purpose, to perform this reinitialization the signal Lrtz-smp toggles for example to the high state so as to close the switch Lrtz-Smp linking the output of the amplifier 3, 24 to the sampling capacitor. Additionally, this same signal Lrtz-smp resets the inputs of the memories 12, with the exception of the memory of the high-order bit, the bit 1. The signal Lrtz-smp is linked to the "set" input of the memory. In this way, during the logic reinitialization, at the end of the integration phase, the signal Lrtz-smp places the MSB bit in the 1 state and all the other bits in the 0 state. Stated otherwise, the output Q of the MSB memory is in the 1 state and the outputs Q of the other memories are in the 0 state. This MSB memory associated with the first capacitor 1 of the battery, having the largest capacitance value, for example C/2, controls half of the storage capacitance by itself. The other bits control the other half.

At the end of the integration phase, the potential reached on the sampling capacitor is arbitrary, it corresponds either to the potential of the common electrode for the high-impedance setup, or to the potential of the individual electrodes for the low-impedance setup.

During the digitization phase 312, the device according to the invention seeks the combination of capacitor sections which, containing the same quantity of charge, is at a defined potential, the combination representing the binary equivalent of the potential reached and of the charge accumulated. For this purpose impulse test signals 33, 34, 35 will successively be dispatched to the inputs of the logic gates 13. In this phase 312, the individual electrodes can be connected to the potentials Vone and Vzero, or Vlog and ground via the switches 100, 101, 102,103. One of the switches 100, 103, situated between an individual electrode and one of these potentials, is for example permanently in the on state during this phase. A switch 101 set to the on state by the output Q of the associated memory 12 links the electrode to the potential Vlog or Vone, another switch 102 set to the on state by the inverse output of Q links the electrode to the potential Vzero or ground. In this way and depending on the state of the output Q a charge transfer is performed between the capacitors. More precisely, the switches 100, 101, 102,103 make it possible to take each of the individual electrodes to two distinct potentials, corresponding to the two logic states, that is to say to transfer or not to transfer the electric charge carried by each capacitor 1, 11 of the battery to all the other elements of the battery.

To describe the establishment of the digital value reference is made by way of example to the high-impedance setup of FIG. 2. A priori, the voltage reached at the level of the common electrode is arbitrary and therefore unknown. This voltage is compared with the voltage Vthresh by the comparator 21. If the common electrode has reached this value Vthresh, the maximum envisaged value, the output of the comparator 21 is for example already in the 0 state at the start of the digitization phase, the voltage Vthresh being linked to the positive input of the comparator and the output of the follower amplifier 24 being linked to the positive input. In this case the logic gates 13, which are for example "and" gates, see their output toggle to the 0 state. These outputs being linked to the "Reset" inputs of the memories, it follows from this that all the outputs of the memories are forced to and stored in the 0 state. The bits therefore display the value 0. In this case, the value Vthresh reached is coded to 00 . . . 0.

If the voltage at the output of the follower amplifier 24 is less than Vthresh, the output of the comparator 21 remains in the 1 state and therefore does not influence the output of the logic gates 13. A first test signal Test 1 is then dispatched to an input of the logic gate 13 of the high-order memory 12. The weighing of the charges proceeds thus in N successive steps controlled by the signals Test 1 to Test N. In a multipath system, a single sequencer device, not represented in the figures, provides these signals which are distributed to all the paths, for example as input for the logic gates 13. At each conversion step, the test signal:

on the one hand validates or invalidates, depending on the state of the comparator 21, the bit of the previous step;
on the other hand activates the following bit so as to subject it to the test by the comparator 21.

In the latter test, the output Q of the memory 12 corresponding to the following bit is activated in such a way as to control the on state of the switches 101, 102 so as to take the electrode of the capacitor corresponding to this bit, either to the high potential, Vone or Vlog, or to the low potential, Vzero or ground. The bit is validated if, following the transfer of charge from the capacitor to the other capacitors, the output of the comparator 9, 21 toggles to the 1 state.

During the integration phase, the capacitors 1, 11 being in parallel, they all have the same voltage Vc between their electrodes, only the charge varies from one capacitor to another according to the geometric progression of the capacitance values. The larger the capacitance, the larger the charge accumulated. In the case of the setups of FIGS. 1 and 2, the first capacitor accumulates by itself half the total charge. In the digitization phase, the individual electrodes being disconnected, the capacitors are no longer in parallel and their potential will be able to vary freely as a function of the accumulated charge.

It should be noted that the stray capacitances may be appreciable. The capacitance between the common electrode, and the mechanical ground may be significantly appreciable in comparison to the integration capacitance of the capacitors 1, 11. It stores a charge which cannot be digitized.

In the case of the high-impedance setup, the input potential is equal to the voltage Vrtz before integration and to the voltage Vthresh after digitization. A charge "offset" therefore systematically offsets the measurement but is not an impediment since it is invariant and equal to the quantity Q=(Vthresh−Vrtz). $C_{total}$ where $C_{total}$ represents the stray total capacitance. In the case of a photovoltaic imager for example, the input current is unidirectional outgoing. In this case the initialization of the input potential is to the maximum value of the excursion and Vrtz=Vthresh.

In the case of the low-impedance setup, at the end of the weighing the input of the amplifier 3, having become comparator, has returned very close to the potential $V_{Gris}$, to within a low-order bit, the potential that it had lost during integration. This signifies that no charge error is to be feared at this point and that the stray capacitance between this point and ground, as large as it is, is of no consequence for the conversion. The stray capacitances between the individual electrodes of the capacitors and ground are no more of an impediment since these points are controlled in terms of voltage, firstly by the output of the amplifier, thereafter by the switches controlled by the signals Q and Q inverted.

A device according to the invention exhibits notably the following advantages:
- it allows good efficiency in terms of surface area, by minimizing the proportion of surface area of the silicon used for storing the electric charges;
- the bulkiness is scarcely greater than a conventional circuit at the foot of a column; this is because all the items are reused, in particular the storage capacitors, the amplifiers as well as the logic circuits;
- it allows compatibility with analogue use of the circuit; this is because there is dual reading, analogue at the output of the amplifier 8, and digital;
- it is insensitive to the stray capacitance of the column, as large as it is.

A device according to the invention additionally has numerous applications. The high-impedance setup is particularly suitable for photovoltaic imagers, in the visible or infrared regions notably. The low-impedance setup is suitable notably for bolometric imagers, the bolometer often being associated with a device for baselining the current so as to form a measurement bridge. In this case, it is preferable for the input potential not to vary in the course of charge integration.

The low-impedance setup of FIG. 1 can for example comprise a switch 19 placed at input, where the capacitor charging current arrives. This switch 19 is for example necessary when the input current cannot be cut off precisely at the end of the integration period. Such is the case notably with a bolometric infrared imager when the current results from the difference between the current of the detector and a baselining current and when it is not possible to guarantee to cut them off simultaneously.

Likewise, the setup of FIG. 2 can comprise a switch 19 placed at the same location, at input. This switch is then closed during the integration phase and open during the digitization phase.

Advantageously, a device according to the invention makes it possible to carry out an inverse conversion, that is to say a digital-analogue conversion. For this purpose:
- the memories 12 are for example written from the bus with a given digital value, these writes requiring notably a few additional logic gates (not represented), the individual electrodes of the capacitors 1, 11 being taken to Vone or Vzero according to the state of each memory in the case of the high-impedance setup;
- the reset-to-zero switch 4, Rtz is momentarily closed, this having the effect of pre-charging the capacitors 1, 11 and of bringing the input to the potential $V_{Gris}$.

Thereafter the device toggles to the integration phase, the output of the amplifier 3 is then placed at a potential lying between Vzero and Vone in correspondence with the initial digital code.

This optional digital-analogue conversion function could notably make it possible to configure analogue functions inside an imager circuit for example by using the output digital bus. The analogue voltage obtained can serve at the foot of a column for various functions, for example correction.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A device for measuring an electric charge in the form of a digitized value coded on N bits, comprising:
   a battery of N capacitors for integrating the charge, the capacitors having a common electrode intended to be linked to a current source providing the charge, each capacitor having an individual electrode, the values of the capacitances of the capacitors being in geometric progression, a capacitor corresponding to a bit Q of the digitized value;
   switches connected to each individual electrode operating according to two phases, an integration phase and a digitization phase;
   means for controlling the switches the said switches connecting the capacitors in parallel in the integration phase so as to integrate the charge in the capacitors wherein in the digitization phase each of the individual electrodes are placed in first and second distinct potentials, corresponding to the two logic states of the bit, so as to transfer or not transfer the charge carried by the capacitor to all the other capacitors of the battery;
   a logic unit for performing, in the digitization phase, N tests applied successively to each of the N capacitors of the battery, each test linking the individual electrode of the tested capacitor to the first potential, in comparing the potential reached by the common electrode with a defined potential (Vthresh), in defining the value of the bit Q corresponding to the capacitor tested as a function of the comparison result, then in linking the individual electrode to the second potential only if the bit Q is equal to a predefined value.

2. The device according to claim 1, wherein an individual electrode of a capacitor is connected to a charge transfer circuit comprising switches said electrode being linked electrically:
   to a high potential (Vone, Vlog) by two switches in series, a first switch being set to the on state in the digitization phase, the state of the other switch being dependent on the state Q storing the value of the bit associated with the capacitor;
   to a low potential, by two switches in series, a first switch being set to the on state in the integration phase, the state of the other switch being dependent on the state inverse to the previous state Q.

3. The device according to claim 1, wherein it comprises a switch for initializing the voltage between the electrodes of the capacitors.

4. The device according to claim 1, wherein it comprises a circuit for sampling the defined potential at the end of the digitization phase.

5. The device according to claim 4, wherein the sampling circuit comprises a capacitor in series with a switch.

6. The device according to claim 1, wherein each individual electrode is connected in series with a switch electrically linking it to the output of an amplifier, an input of the amplifier being linked to a reference potential ($V_{Gris}$) and the other input being linked to the common electrode, the switch being ordered to close during the integration phase.

7. The device according to claim 6, wherein the output of the amplifier is linked to the input of a comparator.

8. The device according to claim 1, wherein each individual electrode is connected in series with a switch electrically linking it to a fixed potential, the switch being ordered to close during the integration phase.

9. The device according to claim 1, wherein, during the integration phase, the capacitors being in parallel, the capacitors have the same voltage (Vc) between their electrodes.

* * * * *